(12) United States Patent
Hachino et al.

(10) Patent No.: US 7,336,520 B2
(45) Date of Patent: Feb. 26, 2008

(54) STORAGE DEVICE AND SEMICONDUCTOR APPARATUS

(75) Inventors: Hidenari Hachino, Nagasaki (JP); Nobumichi Okazaki, Kanagawa (JP); Katsuhisa Aratani, Chiba (JP)

(73) Assignee: Sony Corporation, Tokyo (JP)

( * ) Notice: Subject to any disclaimer, the term of this patent is extended or adjusted under 35 U.S.C. 154(b) by 78 days.

(21) Appl. No.: 11/422,483

(22) Filed: Jun. 6, 2006

(65) Prior Publication Data

US 2006/0279983 A1 Dec. 14, 2006

(30) Foreign Application Priority Data

Jun. 9, 2005 (JP) .......................... P2005-169035

(51) Int. Cl.
*G11C 11/00* (2006.01)
(52) U.S. Cl. ....................... 365/148; 365/100
(58) Field of Classification Search ................ 365/148, 365/100, 189.09
See application file for complete search history.

(56) References Cited

U.S. PATENT DOCUMENTS

| | | | |
|---|---|---|---|
| 5,495,442 A * | 2/1996 | Cernea et al. | 365/185.03 |
| 5,761,115 A | 6/1998 | Kozicki et al. | |
| 6,404,668 B2 * | 6/2002 | Kowarik et al. | 365/145 |
| 6,856,536 B2 * | 2/2005 | Rinerson et al. | 365/148 |

FOREIGN PATENT DOCUMENTS

JP 2002-536840 10/2002

OTHER PUBLICATIONS

Beck, J.G. et al.; Reproducible switching effect in thin oxide films for memory applications; Applied Physics Letters; vol. 77, No. 1; Jul. 3, 2000.
W.W. Zhuang et al.; Novell Colossal Magnetoresistive Thin Film Nonvolatile Resistance Random Access Memory (RRAM); Technical Digest International Electro Device Meeting; IEEE; 2002.

* cited by examiner

*Primary Examiner*—Vu A. Le
(74) *Attorney, Agent, or Firm*—Sonnenschein Nath & Rosenthal LLP

(57) ABSTRACT

A storage device includes a storage element having first and second terminals that cause a first electrical characteristic change when an electric signal of a first threshold level or higher is applied and that cause a second electrical characteristic change, which is asymmetrical to the first electrical characteristic change, when an electric signal of a second threshold level or higher, the polarity of the electric signal of the second threshold level or higher being different from the polarity of the electric signal of the first threshold level or higher, is applied; and a unipolar transistor connected in series with the storage element. One of the first terminal and the second terminal of the storage element is electrically connected to the unipolar transistor. The unipolar transistor has a negative polarity or a positive polarity in accordance with the first terminal or the second terminal electrically connected to the unipolar transistor.

7 Claims, 12 Drawing Sheets

STORAGE DEVICE AND SEMICONDUCTOR APPARATUS

CROSS REFERENCES TO RELATED APPLICATIONS

The present invention contains subject matter related to Japanese Patent Application JP 2005-169035 filed in the Japanese Patent Office on Jun. 9, 2005, the entire contents of which are incorporated herein by reference.

BACKGROUND OF THE INVENTION

1. Field of the Invention

The present invention relates to storage devices and semiconductor apparatuses, and more particularly, to a storage device and a semiconductor apparatus that include memory cells each including a storage element storing and holding information in accordance with an electric resistance state.

2. Description of the Related Art

In information apparatuses, such as computers, high-density dynamic random access memories (DRAMs) with high operation speed are widely used as random access memories (RAMs).

However, since DRAMs are volatile memories, which lose information when the power is turned off, nonvolatile memories, which hold information even after the power is turned off, are desired.

Thus, ferroelectric random access memories (FeRAMs), magnetic random access memories (MRAMs), phase change memories, and resistance change memories, such as programmable metallization cells (PMCs) and resistance random access memories (RRAMs), are suggested as promising nonvolatile memories.

Such nonvolatile memories are capable of holding written information for a long time without supplying power. In addition, since a refresh operation is not necessary for nonvolatile memories, the power consumption can be reduced.

The resistance change nonvolatile memories, such as PMCs and RRAMs, have a relatively simple configuration in which a material having a characteristic in that the resistance changes by application of a voltage or a current is used for a storage layer storing and holding information and in which a voltage or a current is applied to two electrodes provided so as to sandwich the storage layer therebetween. Thus, miniaturization of a storage element can be easily achieved.

PMCs have a configuration in which an ionic conductor containing a predetermined metal is sandwiched between two electrodes, and the metal contained within the ionic conductor is also contained within one of the two electrodes. Thus, PMCs utilize a characteristic in which an electrical characteristic of the ionic conductor, such as resistance or capacitance, changes when a voltage is applied across the two electrodes.

More specifically, the ionic conductor is made of a solid solution of chalcogenide and metal (for example, amorphous GeS or amorphous GeSe), and one of the two electrodes contains Ag, Cu, or Zn (see, for example, PCT Japanese Translation Patent Publication No. 2002-536840).

A configuration of an RRAM, for example, in which a polycrystalline $PrCaMnO_3$ thin film is sandwiched between two electrodes and in which the resistance of the $PrCaMnO_3$ thin film, which is a recording film, greatly changes in accordance with application of voltage pulses or current pulses to the two electrodes is described, for example, in "Novel Colossal Magnetoresistive Thin Film Nonvolatile Resistance Random Access Memory (RRAM)" written by W. W. Zhuang et al. in Technical Digest "International Electron Devices Meeting", 2002, p. 193. A voltage pulse whose polarity changes depending on recording (writing) or erasing of information is applied.

Another configuration of an RRAM, for example, in which $SrZrO3$ into which a small amount of Cr is doped (monocrystal or polycrystal) is sandwiched between two electrodes and in which the resistance of a recording film changes in accordance with currents flowing from the electrodes is described, for example, in "Reproducible Switching Effect in Thin Oxide Films for Memory Applications" written by A. Beck et al., in Applied Physics Letters, 2000, vol. 77, p. 139-141.

In this document, a current-voltage (I-V) characteristic of the storage layer is described, and threshold voltages in recording and erasing are ±0.5 V. With this configuration, information can be recorded and erased in accordance with application of voltage pulses. Necessary pulse voltages are ±1.1 V and a necessary voltage pulse width is 2 milliseconds. In addition, recording and erasing can be performed at high speed, and an operation can be performed with a voltage pulse width of 100 nanoseconds. In this case, necessary pulse voltages are ±5 V.

However, under the present situation, it is difficult for FeRAMs to perform nondestructive reading. Since FeRAMs perform destructive reading, the reading speed of FeRAMs is slow. In addition, since there is a restriction on the number of times polarization reversal according to reading or recording can be performed, the number of rewritable times is limited.

MRAMs use a magnetic field for recording, and a current flowing through wiring generates the magnetic field. Thus, a large amount of current is necessary for recording.

Phase change memories, which perform recording by application of voltage pulses with the same polarity and different sizes, perform switching depending on temperature. Thus, phase change memories are susceptible to changes in the ambient temperature.

In the PMC described in PCT Japanese Translation Patent Publication No. 2002-536840, the crystallization temperature of amorphous GeS or amorphous GeSe is about 200° C., and a characteristic is deteriorated when an ionic conductor is crystallized. Thus, the PMC does not endure high temperature in an actual process for manufacturing a storage element, for example, a process for forming a chemical vapor deposition (CVD) insulating film or a protection film.

A material of a storage layer suggested for the RRAM described in each of the document titled "Novel Colossal Magnetoresistive Thin Film Nonvolatile Resistance Random Access Memory (RRAM)" and the document titled "Reproducible Switching Effect in Thin Oxide Films for Memory Applications" is crystalline. Thus, processing at a temperature of about 600° C. is necessary, it is extremely difficult to manufacture monocrystal of the suggested material, and miniaturization is difficult due to the influence of grain boundary when polycrystal is used.

In addition, although recording and erasing of information performed by application of pulse voltages is suggested for the above-described RRAMs, the resistance of the storage layer after recording changes depending on the pulse width of the applied pulse voltage in the suggested configurations. In addition, the fact that the resistance after recording depends on the pulse width for the recording indirectly indicates that the resistance changes even when the same pulse is repeatedly applied.

For example, as reported in the document titled "Novel Colossal Magnetoresistive Thin Film Nonvolatile Resistance Random Access Memory (RRAM)", when pulses with the same polarity are applied, the resistance after recording greatly changes depending on the pulse width. When the pulse width is shorter, such as less than 50 nanoseconds, the resistance change ratio by recording is lower. When the pulse with is longer, such as more than 100 nanoseconds, instead of being saturated at a constant value, a resistance closer to the resistance before recording is acquired as the pulse width increases. In addition, the document titled "Novel Colossal Magnetoresistive Thin Film Nonvolatile Resistance Random Access Memory (RRAM)" describes features of the memory configuration in which a storage layer is connected in series with a metal-oxide semiconductor (MOS) transistor for access control and in which the storage layer and the MOS transistor are disposed in an array form. When the pulse width changes within a range between 10 nanoseconds and 100 nanoseconds, the resistance of the storage layer after recording changes depending on the pulse width. If the pulse width is much longer, it is predicted, from the characteristic of the storage layer, that the resistance decreases again.

In other words, RRAMs have a feature in which the resistance after recording depends on the size of a pulse voltage and a pulse width. Thus, variations in the size of the pulse voltage and in the pulse width cause variations in the resistance after recording.

Thus, a pulse voltage with a pulse width shorter than about 100 nanoseconds has a lower resistance ratio by recording and is susceptible to variations in the resistance after recording. Thus, it is difficult to perform stable recording.

Thus, when recording is performed using such a pulse voltage with a shorter pulse width, it is necessary to perform a process for verifying the content of information after recording is performed, in order to reliably perform recording.

For example, before recording, a process for reading and verifying the content of information that has already been recorded in a storage element (the resistance of a storage layer) is performed. Then, recording is performed so as to correspond to the relationship between the verified content (resistance) and the content (resistance) to be recorded. Alternatively, for example, after recording, a process for reading and verifying the content of information recorded in the storage element is performed. If the verified resistance is different from a desired resistance, re-recording is performed to correct the verified resistance to the desired resistance.

Thus, a longer period of time is spent for recording, and, for example, it is difficult to perform overwriting of data or the like at high speed.

In order to solve such problems, a storage device is suggested, for example, in Japanese Patent Application No. 2004-22121. In the storage device, a memory cell includes a storage element having a characteristic in which the resistance changes in accordance with application of a voltage of a threshold level or higher across both ends and a circuit element that is connected in series with the storage element and that serves as a load. The storage device has a characteristic in which, when the voltage applied across ends of the storage device and the circuit element is the threshold level or higher, the combined resistance of the storage element and the circuit element of the memory cell after the resistance of the storage element changes from a higher state to a lower state is substantially constant irrespective of the size of the voltage. Such a storage device realizes a stable recording operation, and reduces the period of time necessary for recording of information.

SUMMARY OF THE INVENTION

When an operation for changing the resistance of the storage element from a higher state to a lower state is defined as "writing" and an operation for changing the resistance of the storage element from the lower state to the higher state is defined as "erasing", in order to realize writing and erasing using the storage device described in Japanese Patent Application No. 2004-22121, it is necessary to define a voltage range to be applied to a memory cell and to properly set the positional relationship between a storage element and a circuit element constituting the memory cell or properly set the polarity of the circuit element. Thus, writing and erasing using the storage device can be achieved by applying a voltage within a predetermined range to the memory cell and by setting the storage element and the circuit element to the predetermined positions or setting the circuit element to have a predetermined polarity.

Accordingly, it is desirable to provide a storage device and a semiconductor apparatus capable of stably performing recording, reducing the period of time necessary for recording information, and performing writing and erasing.

A storage device according to an embodiment of the present invention includes a storage element having a first terminal and a second terminal that cause a first electrical characteristic change when an electric signal of a first threshold level or higher is applied and that cause a second electrical characteristic change, which is asymmetrical to the first electrical characteristic change, when an electric signal of a second threshold level or higher, the polarity of the electric signal of the second threshold level or higher being different from the polarity of the electric signal of the first threshold level or higher, is applied; and a unipolar transistor connected in series with the storage element. Only one of the first terminal and the second terminal of the storage element is electrically connected to the unipolar transistor. The unipolar transistor has a negative polarity or a positive polarity in accordance with the first terminal or the second terminal that is electrically connected to the unipolar transistor.

Since only one of the first terminal and the second terminal of the storage element is electrically connected to the unipolar transistor and the unipolar transistor has a negative polarity or a positive polarity in accordance with the first terminal or the second terminal that is electrically connected to the unipolar transistor, the storage element causes the first electrical characteristic change when an electric signal of a first threshold level or higher is applied and the storage element causes the second electrical characteristic change when an electric signal of a second threshold level or higher is applied.

The description stating that the first electrical characteristic change is asymmetrical to the second electrical characteristic change means that condition changes with respect to the direction of an electric signal, such as an applied voltage or current, are different. For example, when the first electrical characteristic change represents that the resistance of the storage element changes from a higher state to a lower state and the second electrical characteristic change represents that the resistance of the storage element changes from the lower state to the higher state, the first electrical characteristic change is asymmetrical to the second electrical characteristic change. For example, a resistor and a capacitance are elements causing a symmetrical electrical characteristic change. For example, a diode is an element causing an asymmetrical electrical characteristic change.

In addition, the unipolar transistor has only one of a negative polarity and a positive polarity in accordance with the first terminal or the second terminal that is electrically connected to the unipolar transistor. The unipolar transistor does not have both the negative and positive polarities.

A storage device according to an embodiment of the present invention includes a plurality of memory cells. Each of the plurality of memory cells includes a storage element having a characteristic in that the resistance thereof changes from a higher state to a lower state when an electric signal of a first threshold level or higher is applied and in that the resistance changes from the lower state to the higher state when an electric signal of a second threshold level or higher, the polarity of the electric signal of the second threshold level or higher being different from the polarity of the electric signal of the first threshold level or higher, is applied, and a unipolar transistor connected in series with the storage element. A predetermined potential is applied to a first end of each of the memory cells, and a first potential that is higher than the predetermined potential or a second potential that is lower than the predetermined potential is applied to a second end of each of the memory cells near the unipolar transistor. The polarity of the unipolar transistor is negative when information is written to the storage element by application of the first potential to the second end of each of the memory cells. The polarity of the unipolar transistor is positive when information is written to the storage element by application of the second potential to the second end of each of the memory cells.

Since the polarity of the unipolar transistor is negative when information is written to the storage element by application of the first potential to the second end of each of the memory cells and the polarity of the unipolar transistor is positive when information is written to the storage element by application of the second potential to the second end of each of the memory cells, the resistance of the storage element is changed from the higher state to the lower state by application of the electric signal of the first threshold level or higher to the storage element and the resistance of the storage element whose resistance is changed to the lower state by application of the electric signal of the first threshold level or higher to the storage element is changed from the lower state to the higher state. Accordingly, writing and erasing on the storage element can be performed.

Even if an electric signal of the second threshold level or higher is applied to the storage element, erasing on the electric element on which writing has been performed is not enabled unless the resistance of the storage element whose resistance is changed to the lower state by application of an electric signal of the first threshold level or higher is changed from the lower state to the higher state.

A storage device according to an embodiment of the present invention includes a plurality of memory cells. Each of the plurality of memory cells includes a storage element that includes a storage layer sandwiched between a first electrode and a second electrode and that has a characteristic in that the resistance thereof changes from a higher state to a lower state when an electric signal of a first threshold level or higher is applied across the first electrode and the second electrode and in that the resistance changes from the lower state to the higher state when an electric signal of a second threshold level or higher, the polarity of the electric signal of the second threshold level or higher being different from the polarity of the electric signal of the first threshold level or higher, is applied across the first electrode and the second electrode, and a unipolar transistor connected in series with a portion of the storage element near the second electrode. First electrodes of the plurality of memory cells are formed by an identical metal layer, and the unipolar transistor has a positive polarity.

A semiconductor apparatus includes a storage device. The storage device includes a plurality of memory cells. Each of the plurality of memory cells includes a storage element that includes a storage layer sandwiched between a first electrode and a second electrode and that has a characteristic in that the resistance thereof changes from a higher state to a lower state when an electric signal of a first threshold level or higher is applied across the first electrode and the second electrode and in that the resistance changes from the lower state to the higher state when an electric signal of a second threshold level or higher, the polarity of the electric signal of the second threshold level or higher being different from the polarity of the electric signal of the first threshold level or higher, is applied across the first electrode and the second electrode, and a unipolar transistor connected in series with a portion of the storage element near the second electrode. First electrodes of the plurality of memory cells are formed by an identical metal layer, and the unipolar transistor has a positive polarity.

Since the first electrodes of the plurality of memory cells are formed by an identical metal layer and the unipolar transistor has a positive polarity, the resistance of the storage element changes from a higher state to a lower state by application of an electric signal of a first threshold level or higher and the resistance of the storage element whose resistance is changed to the lower state by application of the electric signal of the first threshold level or higher to the storage element can be changed from the lower state to the higher state. Accordingly, writing and erasing on the storage element can be performed.

For the first electrodes of the plurality of memory cells formed by an identical metal layer, the resistance of the storage element is changed from the higher state to the lower state by application of an electric signal of the first threshold level or higher to the storage element. In addition, a voltage within a range in which the resistance of the storage element whose resistance is changed to the lower state by application of the electric signal of the first threshold level or higher to the storage element can be changed from the lower state to the higher state is applied.

In the storage device and the semiconductor apparatus, information can be stably recorded, the period of time necessary for recording information can be reduced, and writing and erasing can be performed.

DESCRIPTION OF THE PREFERRED EMBODIMENTS

Embodiments of the present invention will be described with reference to the drawings.

In the embodiments of the present invention, a storage device includes a resistance change storage element (hereinafter, referred to as a memory element) used for a memory cell.

Figure 1:
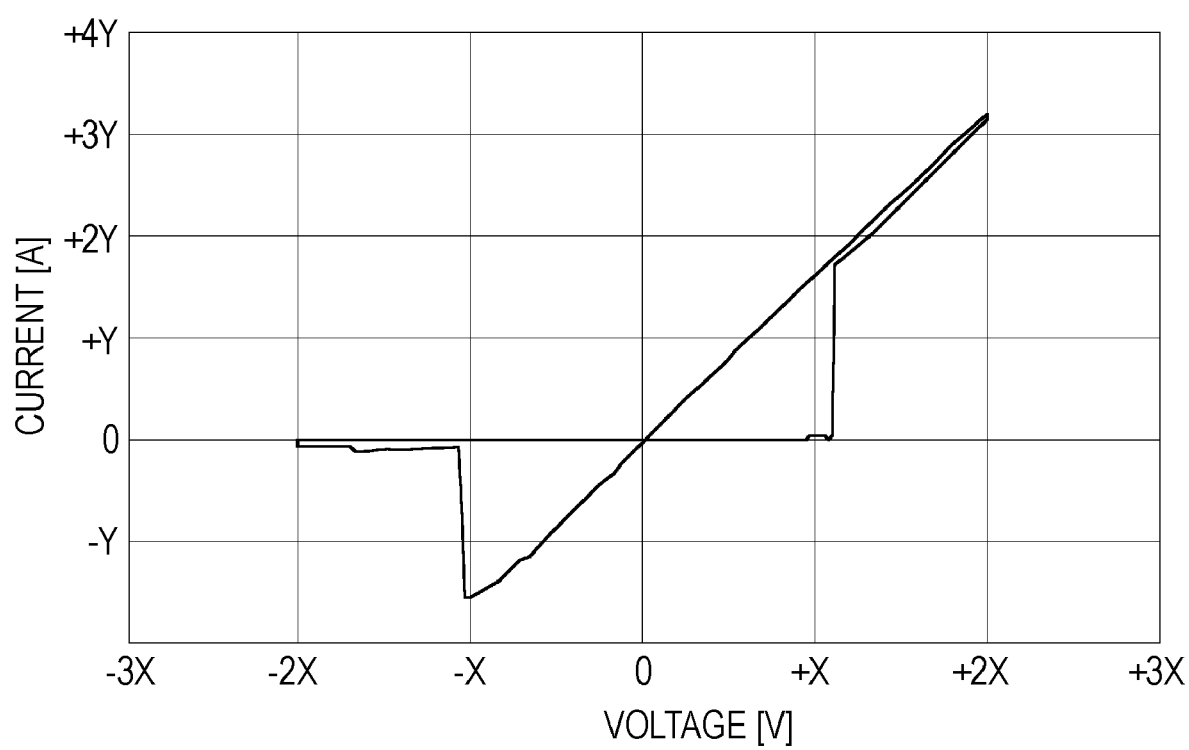
FIG. 1 is a graph showing a current-voltage change in a memory element used in a storage device according to an embodiment of the present invention.

FIG. 1 is a graph showing a current-voltage (I-V) change of a memory element used in a storage device according to an embodiment of the present invention.

As a memory element having the I-V characteristic shown in FIG. 1, for example, a storage element including a storage layer that is sandwiched between a first electrode and a second electrode (for example, between a lower electrode and an upper electrode) and that is made of an amorphous thin film, such as a rare-earth oxide film or the like, is used.

In the initial state, the memory element has a high resistance (for example, 1 MΩ or more), and a current does not flow easily. Referring to FIG. 1, when a voltage of +1.1X V (for example, +0.5 V) or more is applied, a current suddenly increases, and a resistance decreases (for example, several kΩ). Then, the memory element reaches Ohmic features. A current flows in proportion to a voltage, that is, a resistance has a constant value. Then, even if the voltage is returned to 0 V, the constant resistance (lower resistance) is maintained.

Hereinafter, this operation is referred to as "writing", and this state is referred to as "conduction". In addition, the applied voltage at this time is referred to as a "writing voltage threshold".

A voltage whose polarity is opposite to that for writing is applied to the memory element, and the applied voltage is increased. At a voltage of −1.1X V (for example, −0.5 V), the current flowing to the memory element suddenly decreases, that is, a resistance suddenly increases to a high resistance (for example, 1 MΩ or more) that is equal to that in the initial state. Then, even if the voltage is returned to 0 V, the resistance (higher resistance) is maintained.

Hereinafter, this operation is referred to as "erasing", and this state is referred to as "insulation". In addition, the applied voltage at this time is referred to as an "erasing voltage threshold".

By applying positive and negative voltages to the memory element as describe above, the resistance of the memory element can be reversibly changed from several kΩ to about 1 MΩ. In addition, when no voltage is applied to the memory element, that is, the voltage is 0 V, a conduction state or an insulation state can be entered. By associating the conduction state with data 1 and by associating the insulation state with data 0, 1-bit data can be stored.

In FIG. 1, an applied voltage is within a range between −2X and +2X. However, even if a voltage higher than +2X is applied, a memory element used in the storage device according to this embodiment has substantially the same resistance.

Figure 2A:
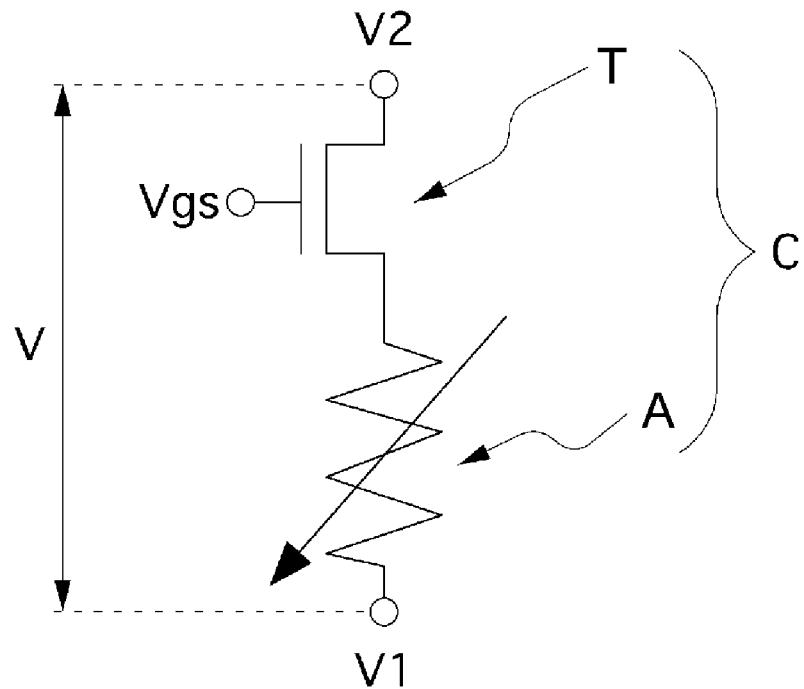
FIGS. 2A and 2B are circuit diagrams for explaining a memory cell used in the storage device according to the embodiment.
Figure 2B:
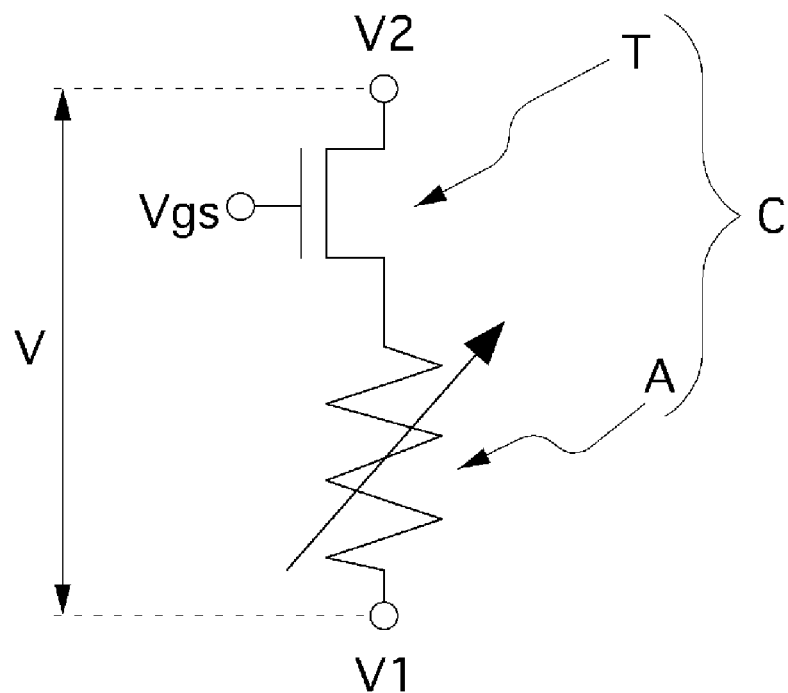

FIGS. 2A and 2B are circuit diagrams for explaining a memory cell C used in the storage device according this embodiment. Referring to FIGS. 2A and 2B, the memory cell C includes a memory element A and a MOS transistor T that are connected in series with each other. Thus, the MOS transistor T serves not only as a switching element for selecting the memory element A to be accessed but also as a load for the memory element A when writing is performed. In this embodiment, the term "MOS transistor" indicates an N-type MOS transistor unless otherwise stated as a P-type MOS transistor.

A terminal voltage V1 is applied to a terminal of the memory element A that is opposite to a terminal connected to the MOS transistor T. A terminal voltage V2 is applied to a terminal of the MOS transistor T (for example, a terminal in the source side) that is opposite to a terminal connected to the memory element A. A gate voltage Vgs is applied to the gate of the MOS transistor T.

Since the terminal voltages V1 and V2 are applied across ends of the memory element A and the MOS transistor T of the memory cell C, a potential difference V (=|V2−V1|) is generated across the terminals.

It is desirable that the resistance of the memory element A when writing is performed be equal to or higher than the on-resistance of the MOS transistor T. This is because since a potential difference applied across the terminals is mostly applied to the MOS transistor T when the resistance of the memory element when erasing starts is low, the electric power is lost and the applied voltage is not efficiently used for changing of the resistance of the memory element A. Since the resistance of the memory element A when writing starts is sufficiently high, the voltage is mostly applied to the memory element A. Thus, such a problem does not occur.

Figure 7:
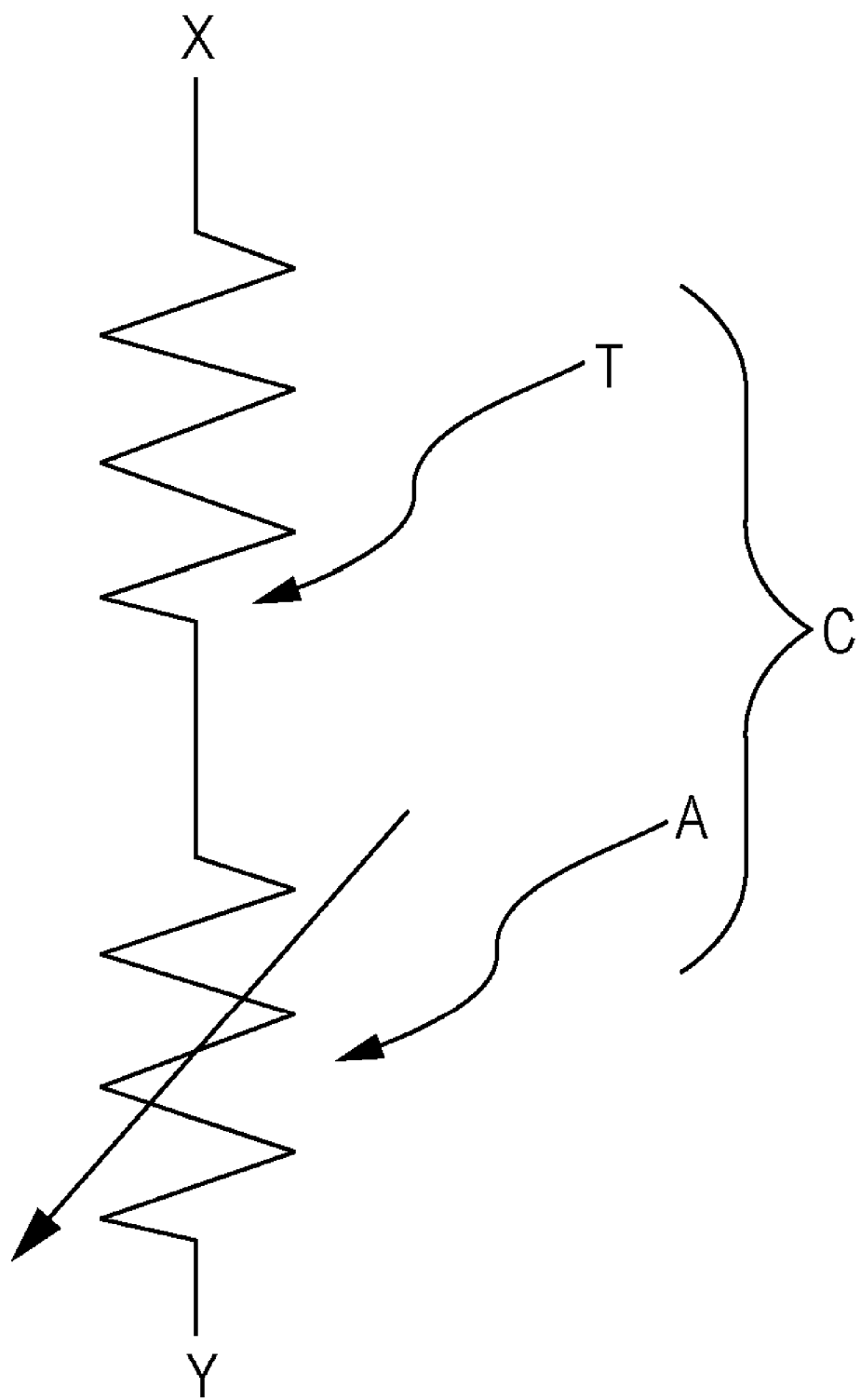
FIG. 7 is a circuit diagram for explaining the concept of a phenomenon in which the resistance immediately after writing is performed on a memory element is determined in accordance with a current flowing to the memory element.

It is known from an experiment that the resistance of the memory element used in this embodiment immediately after writing is performed is not unique to the element and is determined in accordance with a current flowing to the memory element immediately after writing is performed. FIG. 7 is a circuit diagram for explaining the concept of a phenomenon in which the resistance of the memory element immediately after writing is performed is determined in accordance with a current flowing to the memory element.

Referring to FIG. 7, the memory element is connected in series with a load resistor. Here, the memory element is insulated, that is, the resistance of the memory element is 1 MΩ or more.

When a voltage of 0.5 V, which is a writing voltage threshold, is applied across XY terminals in a writing direction (a direction from sign X to sign Y in FIG. 7), since the resistance of the memory element is sufficiently larger than the resistance of the connected load resistor, a voltage of 0.5 V is applied across the memory element. Thus, the memory element is changed from the insulation state to the conduction state.

In addition, it is known from an experiment that the voltage across both terminals of the memory element immediately after writing is performed is constant (for example, about 0.2 V) irrespective of the size of the resistance of the load resistor connected in series with the memory element. Thus, when the load resistance is 1 kΩ, a current of 0.3 mA (=(0.5 V−0.2 V)/1 kΩ) flows, and the resistance of the memory element is 0.67 kΩ (=0.2 V/0.3 mA). When the load resistance is 10 kΩ, a current of 0.03 mA(=(0.5 V−0.2 V)/10 kΩ) flows, and the resistance of the memory element is 6.7 kΩ (=0.2 V/0.03 mA).

As described above, the resistance of the memory element immediately after writing is performed is determined from a current flowing to the memory element, and the determined resistance after writing is performed is constant unless exceeding an erasing voltage threshold (the voltage direction is opposite to that for writing).

For erasing, such a phenomenon does not occur. The insulation resistance changes between several 10 kΩ and 1 MΩ or more, irrespective of the value of the writing resistance.

In accordance with the polarity of the memory element A, two types of configurations are considered for the memory cell C, as shown in FIGS. 2A and 2B.

In FIGS. 2A and 2B, the arrow provided on the memory element A represents a polarity. When a voltage is applied in the direction of the arrow, the memory element A is changed from the insulation state to the conduction state, that is, a writing operation is performed.

FIGS. 3 to 6 are circuit diagrams for explaining the storage device according to this embodiment. In a memory array shown in each of FIGS. 3 to 6, a plurality of memory cells (shown in FIG. 2A or 2B) is disposed in a matrix. In accordance with the polarity of the memory element A and the positional relationship between the memory element A and the MOS transistor T, four types of configurations are considered for the memory array, as shown in FIGS. 3 to 6.

In the light of the above-mentioned points, an optimal potential to be applied to a memory cell will be described.

Figure 3:
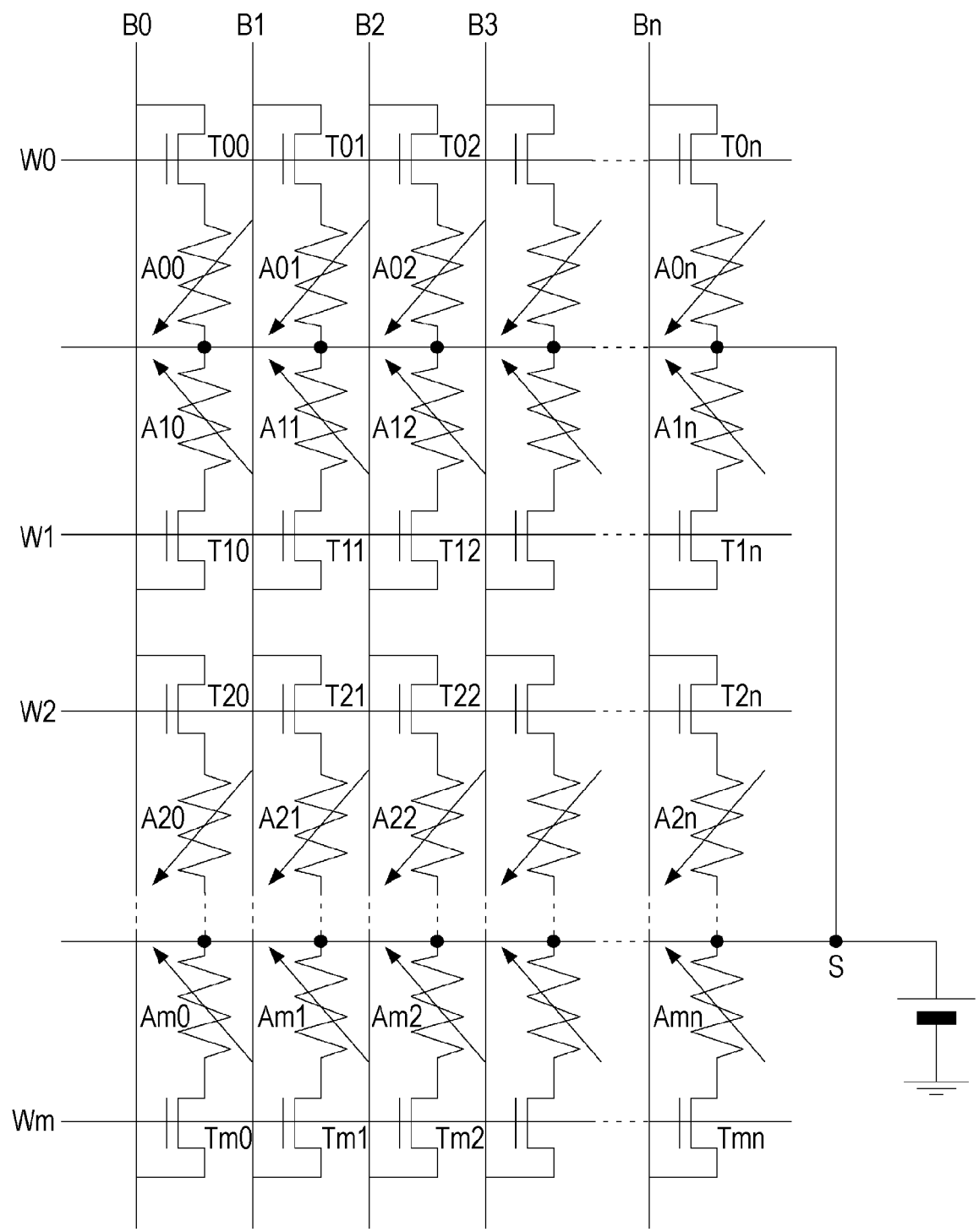
FIG. 3 is a circuit diagram for explaining an example of the storage device according to the embodiment.

The storage device shown in FIG. 3 includes memory cells of (m+1) rows and (n+1) columns disposed in a matrix. In each of the memory cells, one end of a memory element is connected to one end (here, a source) of a MOS transistor, as shown in FIGS. 2A to 2B.

The gates of MOS transistors T (T00 to Tmn) are connected to word lines W (W0 to Wm). The other ends (drains) of the MOS transistors T are connected to bit lines B (B0 to Bn). The other ends of memory elements are connected to a common line S.

Figure 8A:
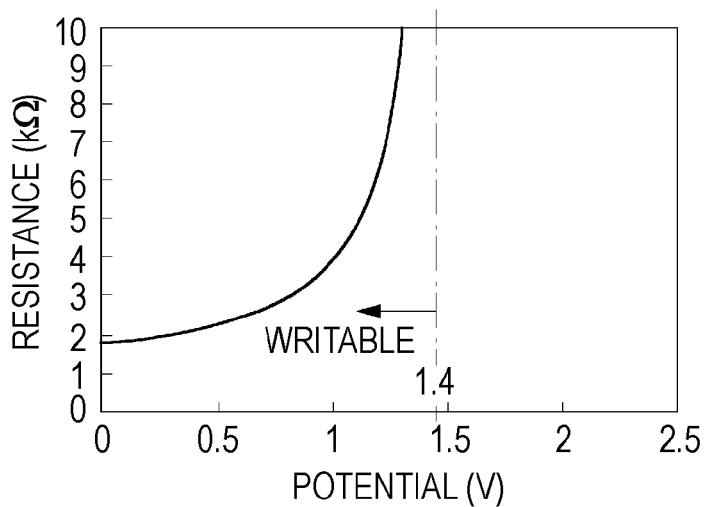
FIGS. 8A to 8C are graphs showing the relationship between the resistance immediately after writing is performed on the memory element in the circuit shown in FIG. 3 and the potential applied to a common line and the relationship between the minimum resistance at which erasing on the memory element is enabled and the potential applied to the common line.

FIG. 8A illustrates the relationship between the resistance immediately after writing is performed on a memory element and the potential applied to a common line in a memory cell shown in the circuit diagram of FIG. 3 when the gate potential (potential applied to a word line) is 2.5 V and the potential applied across bit and source lines is 0.5 V.

As shown in FIG. 8A, when the potential applied to the common line is more than 1.4 V, writing is not enabled. This is because since an increase in the potential applied to the common line relatively reduces the gate potential of the MOS transistor, that is, increases the ON resistance of the MOS transistor and increases the resistance of the memory element immediately after writing, if the potential applied to the common line is more than 1.4 V, the potential across the bit line and the common line is lower than a value obtained by adding a voltage threshold of the MOS transistor and a writing voltage threshold of the memory element.

Figure 8B:
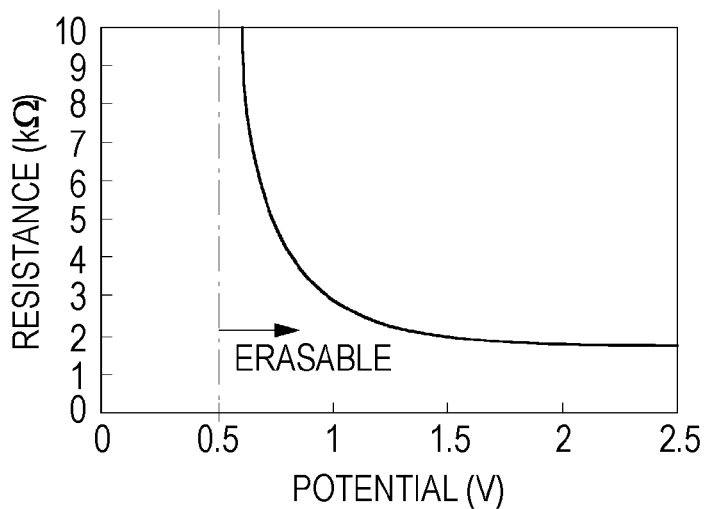

FIG. 8B illustrates the relationship between the minimum resistance of a memory element at which erasing is enabled and the potential applied to a common line in a memory cell shown in the circuit diagram of FIG. 3 when the gate potential is 2.5 V and the bit line potential (potential applied to a bit line) is 0 V.

Here, the voltage applied across the bit line and the common line is divided in accordance with the ratio of the ON resistance of the MOS transistor to the resistance of the memory element. Thus, when the conduction (writing) resistance of the memory element is lower, the voltage applied to the memory element is reduced to less than an erasing voltage threshold. Thus, erasing is not enabled. When the potential applied to the common line increases, the current flowing to the memory element increases. Since the resistance at which erasing is enabled is obtained by dividing the erasing voltage threshold by the current flowing to the memory cell, the lower limit of the resistance at which erasing is enabled decreases.

When the potential applied to the common line is 0.5 V or less, since the voltage across the memory element is 0.5 V, which is the erasing voltage threshold, or less, erasing is not enabled, irrespective of the value of the resistance.

Figure 8C:
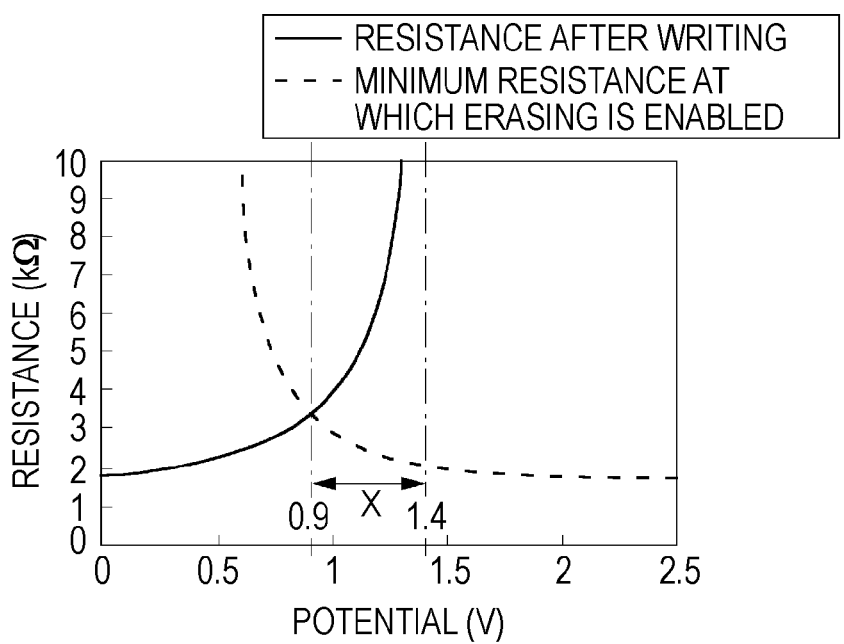

FIG. 8C is a graph obtained by superimposing FIG. 8A on FIG. 8B. The following features are known from FIG. 8C:

when the potential applied to the common line is set to a value within a range between 0.9 V and 1.4 V, writing and erasing are enabled;

when the potential applied to the common line is set to less than 0.9 V, writing is enabled but erasing is not enabled since the resistance immediately after writing is too low; and when the potential applied to the common line is set to more than 1.4 V, erasing is enabled but writing is not enabled.

Thus, in order to achieve both the writing and erasing operations, it is necessary to set the potential applied to the common line to fall within a range (optimal voltage range) between 0.9 V and 1.4 V, which is indicated by sign X in FIG. 8C.

Figure 4:
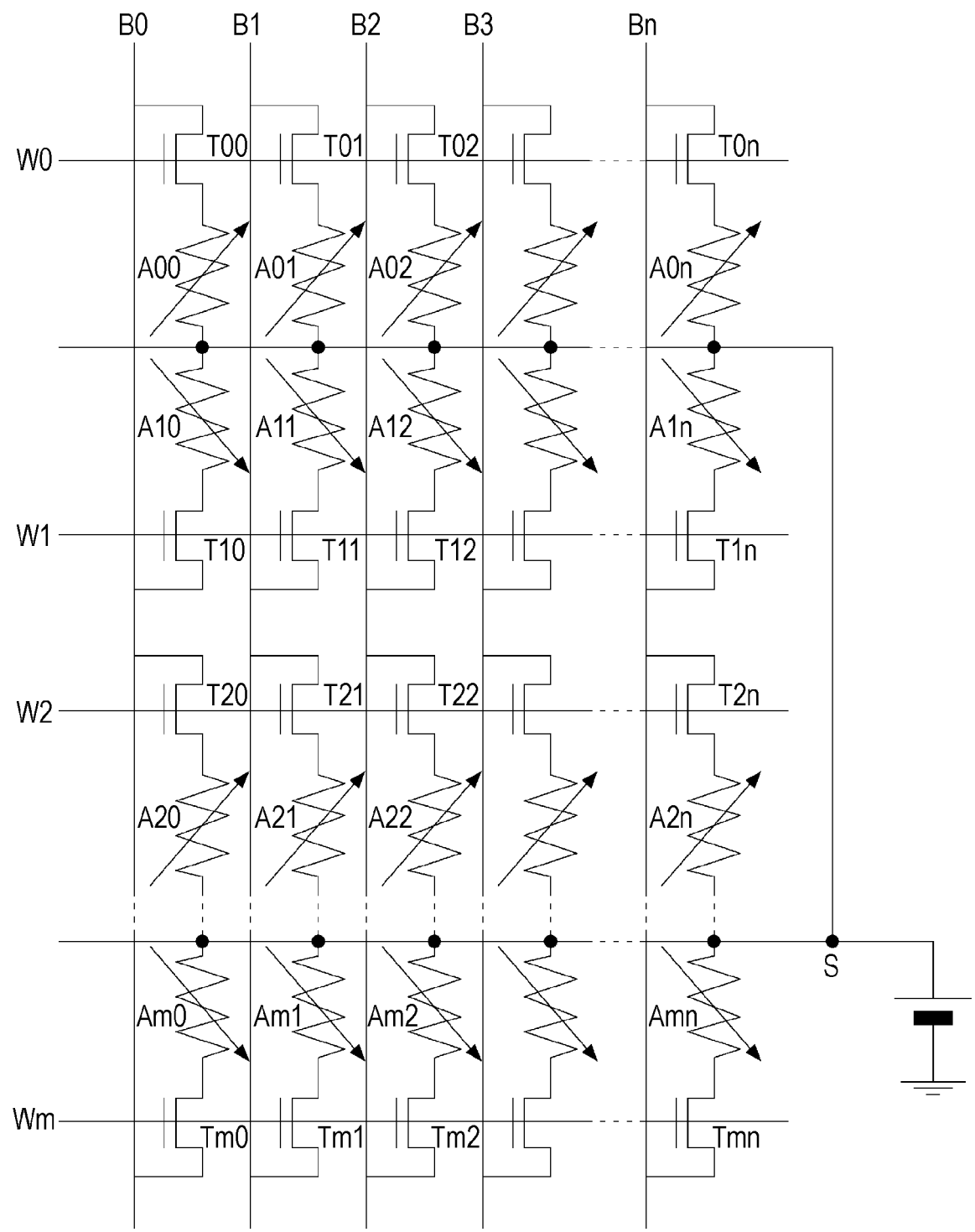
FIG. 4 is a circuit diagram for explaining another example of the storage device according to the embodiment.
Figure 9A:
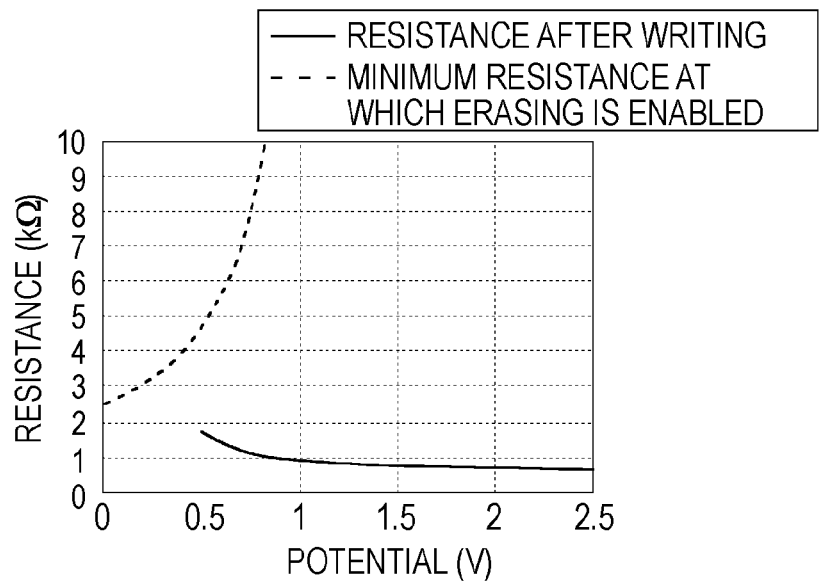
FIGS. 9A to 9C are graphs showing the relationship between the resistance immediately after writing is performed on the memory elements shown in FIGS. 4 to 6 and the potential applied to the common line and the relationship between the minimum resistance at which erasing on the memory elements is enabled and the potential applied to the common line.
Figure 9B:
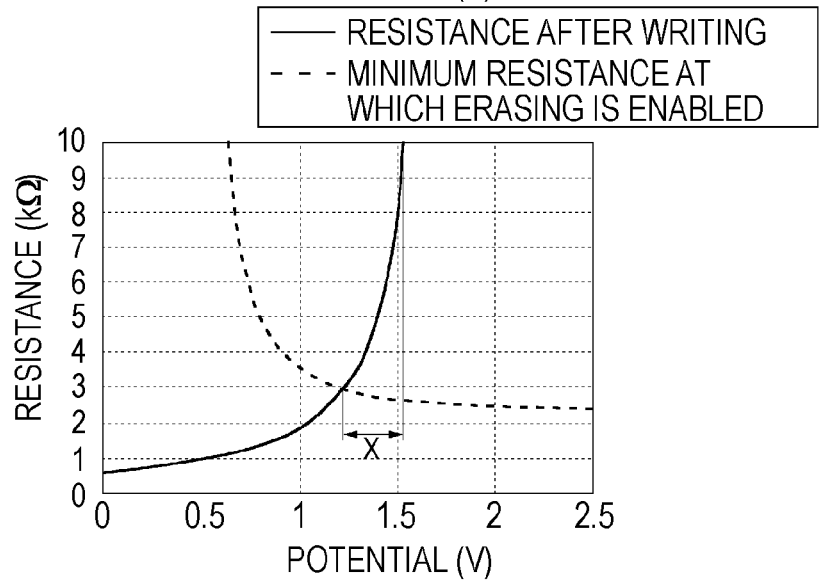
Figure 9C:
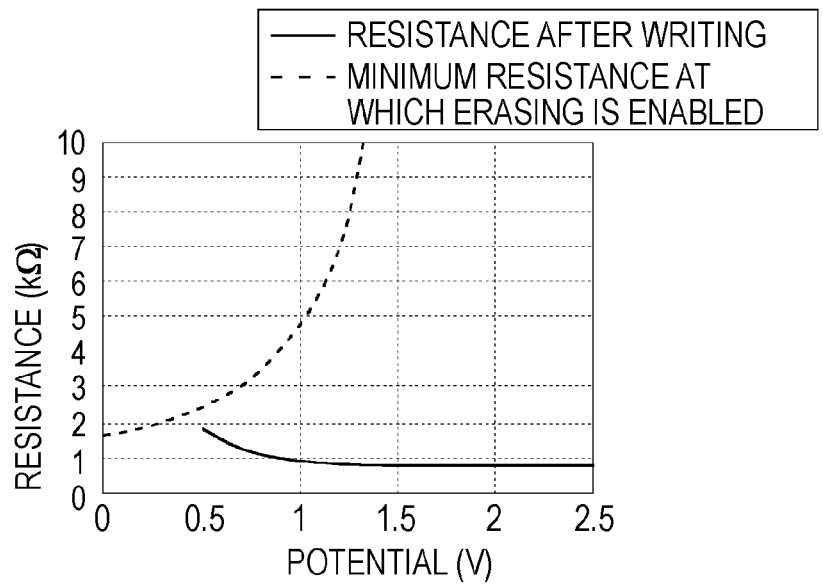

Similarly, FIG. 9A is a graph obtained by superimposing the relationship between the resistance of a memory element immediately after writing is performed and the potential applied to a common line on the relationship between the minimum resistance of the memory element at which erasing is enabled and the potential applied to the common line based on the circuit diagram shown in FIG. 4. In addition, FIG. 9B is a graph obtained by superimposing the relationship between the resistance of a memory element immediately after writing is performed and the potential applied to a common line on the relationship between the minimum resistance of the memory element at which erasing is enabled and the potential applied to the common line based on the circuit diagram shown in FIG. 5. In addition, FIG. 9C is a graph obtained by superimposing the relationship between the resistance of a memory element immediately after writing is performed and the potential applied to a common line on the relationship between the minimum resistance of the memory element at which erasing is enabled and the potential applied to the common line based on the circuit diagram shown in FIG. 6.

Figure 5:
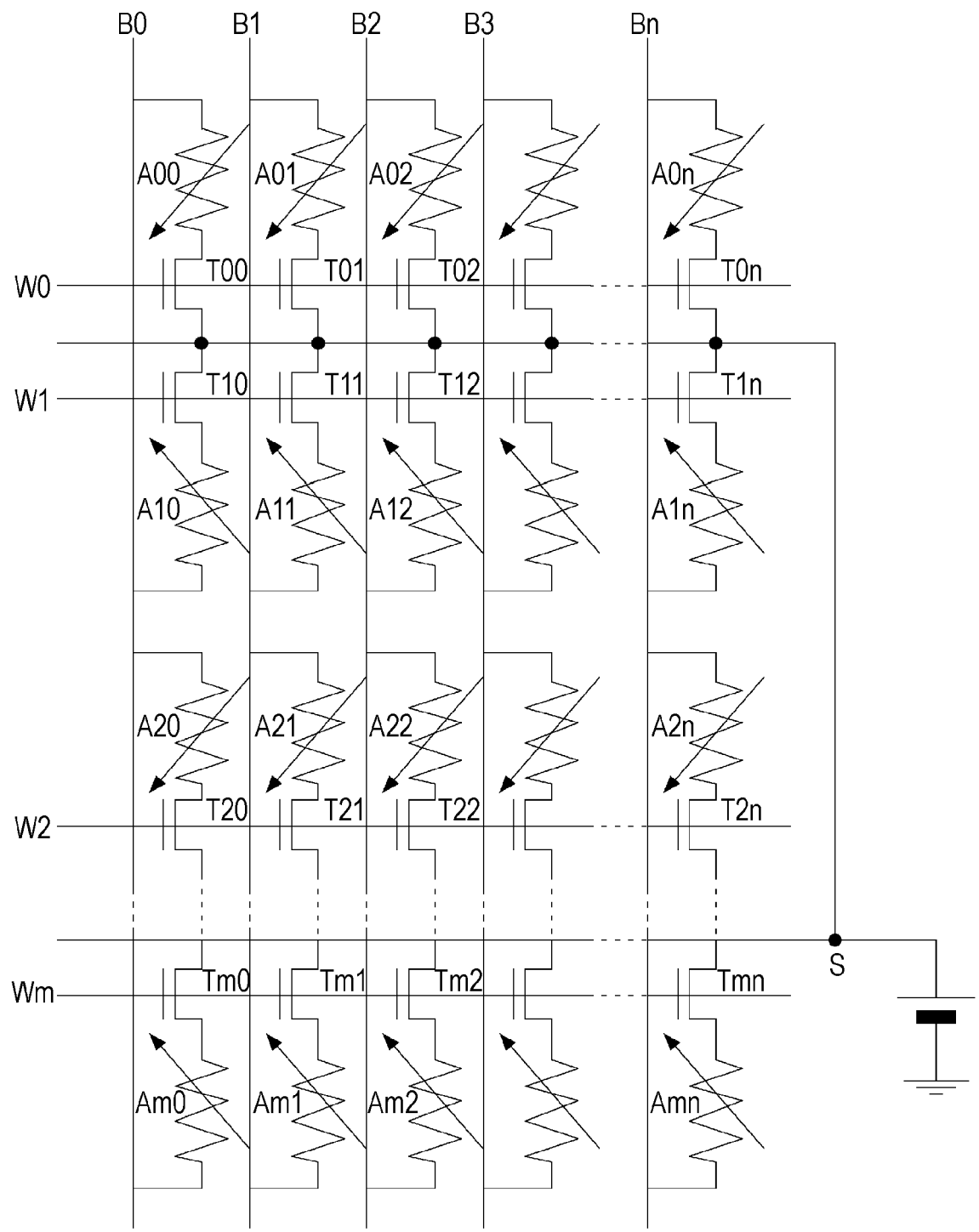
FIG. 5 is a circuit diagram for explaining another example of the storage device according to the embodiment.
Figure 6:
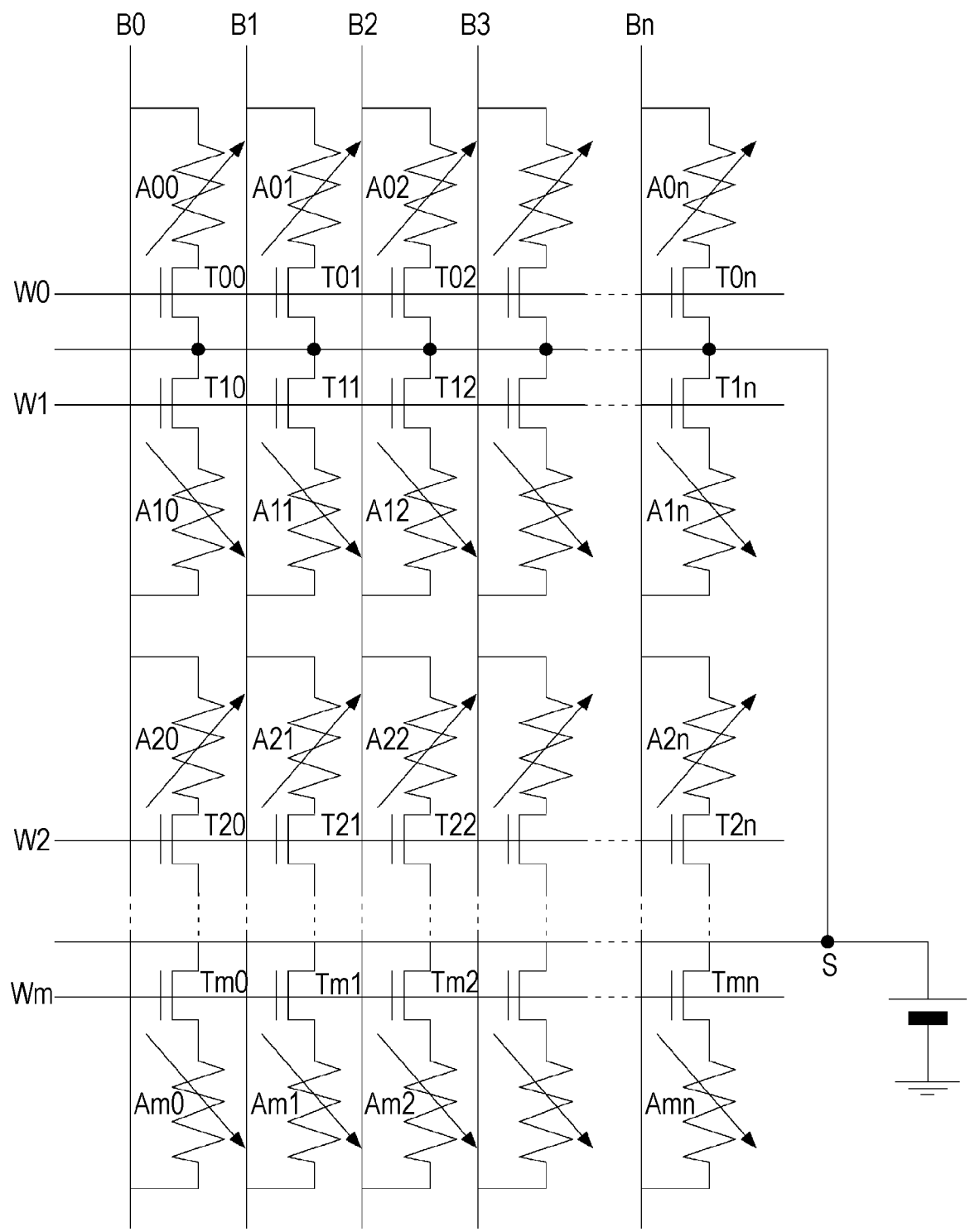
FIG. 6 is a circuit diagram for explaining another example of the storage device according to the embodiment.

As shown in FIG. 8C and FIGS. 9A to 9C, the optimal voltage range X exists in the circuit diagrams shown in FIGS. 3 and 5 but does not exist in the circuit diagrams shown in FIGS. 4 and 6. In other words, in the circuit diagrams shown in FIGS. 4 and 6, although writing is enabled, since the resistance immediately after writing is too low, erasing is not enabled irrespective of the value of the common potential. Thus, erasing on a memory element on which writing has been performed is not achieved.

A reason why existence or nonexistence of an optimal voltage range is determined from the polarity of a memory element and from the positional relationship between the memory element and a MOS transistor is described next. Although the bit line potential is equal to the ground potential or the power supply potential in the description given below, the bit line potential is not necessarily equal to the ground potential or the power supply potential, as long as a potential necessary for reversibly changing the resistance of the memory element can be applied.

Since the polarity of the memory element viewed from the source line is different between the circuit shown in FIG. 3 and the circuit shown in FIG. 4, that is, the direction of a voltage applied across bit and source lines in writing is opposite between the circuit shown in FIG. 3 and the circuit shown in FIG. 4, the gate voltage Vgs of the MOS transistor is different between the circuit shown in FIG. 3 and the circuit shown in FIG. 4.

Figure 10A:
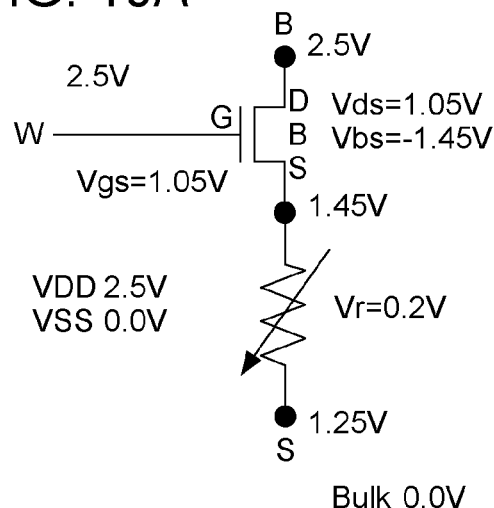
FIGS. 10A to 10D are schematic diagrams for explaining the reason why existence or nonexistence of an optimal voltage range is determined in accordance with the positional relationship between a memory element and a MOS transistor.
Figure 10C:
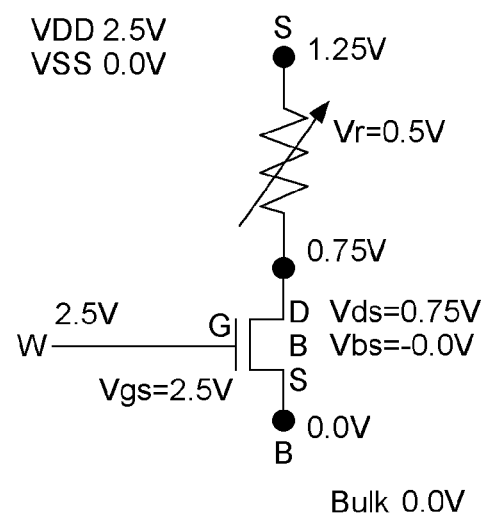
Figure 10B:
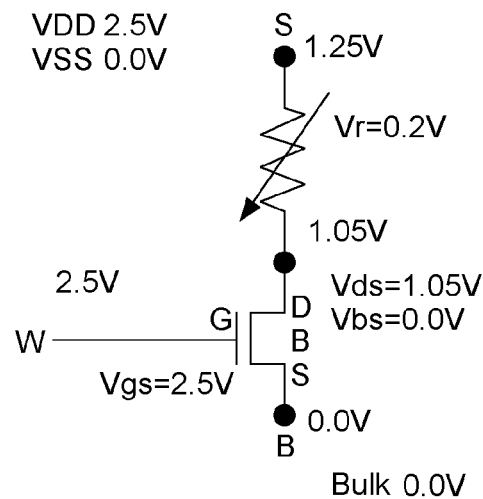

For example, a case where the bit line potential is equal to the ground potential or the power supply potential, the gate potential is 2.5 V, a potential of 1.25 V is applied to the source line, and the voltage across the terminals of the memory element when writing is completed is 0.2 V is considered. In this case, for the circuit shown in FIG. 3, the potential of the source of the MOS transistor when writing is completed is 1.45 V, which is obtained by adding the voltage (0.2 V) across the terminals of the memory element immediately after writing is performed to the potential (1.25 V) of the source line. Thus, the gate voltage Vgs of the MOS transistor is 1.05 V (=2.5 V−1.45 V) (see FIG. 10A). In contrast, for the circuit shown in FIG. 4, the gate voltage Vgs of the MOS transistor is 2.5 V (=2.5 V−0 V) (see FIG. 10B).

As described above, when comparison is made between the circuit shown in FIG. 3 and the circuit shown in FIG. 4, the gate voltage Vgs of the MOS transistor in the circuit shown in FIG. 3 is lower than the gate voltage Vgs of the MOS transistor in the circuit shown in FIG. 4, that is, the current flowing to the memory element in the circuit shown in FIG. 3 is smaller than the current flowing to the memory element in the circuit shown in FIG. 4. When taking into consideration that the voltage across the terminals of the memory element when writing is completed is constant, the resistance of the memory element after writing in the circuit shown in FIG. 3 is higher than the resistance of the memory element after writing in the circuit shown in FIG. 4.

Similarly, since the direction of a voltage applied across the bit and source lines in erasing is opposite between the circuit shown in FIG. 3 and the circuit shown in FIG. 4, the gate voltage Vgs of the MOS transistor is different between the circuit shown in FIG. 3 and the circuit shown in FIG. 4.

Figure 10D:
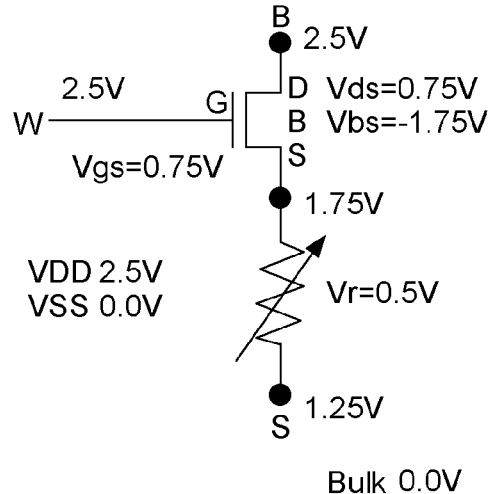

For example, a case where the bit line potential is equal to the ground potential or the power supply potential, the gate potential is 2.5 V, a potential of 1.25 V is applied to the source line, and the voltage across the terminals of the memory element when erasing starts is 0.5 V is considered. In this case, for the circuit shown in FIG. 3, the gate voltage Vgs of the MOS transistor is 2.5 V (=2.5 V−0 V) (see FIG. 10C). In contrast, for the circuit shown in FIG. 4, the potential of the source of the MOS transistor is 1.75 V, which is obtained by adding the voltage (0.5 V) across the terminals of the memory element when erasing starts to the potential (1.25 V) of the source line. Thus, the gate voltage Vgs of the MOS transistor is 0.75 V (=2.5 V−1.75 V) (see FIG. 10D).

As described above, when comparison is made between the circuit shown in FIG. 3 and the circuit shown in FIG. 4, the gate voltage Vgs of the MOS transistor in the circuit shown in FIG. 3 is higher than the gate voltage Vgs of the MOS transistor in the circuit shown in FIG. 4, that is, the current flowing to the memory element in the circuit shown in FIG. 3 is larger than the current flowing to the memory element in the circuit shown in FIG. 4. When taking into consideration that the voltage across the terminals of the memory element when erasing starts is constant, the lower limit of the resistance at which erasing is enabled in the circuit shown in FIG. 3 is lower than the lower limit of the resistance at which erasing is enabled in the circuit shown in FIG. 4.

In addition, when taking into consideration that the voltage across the terminals of the memory element when erasing starts is constant, as the resistance of the memory element after writing is higher, erasing can be performed easier.

As described above, in accordance with the positional relationship between a memory element and a MOS transistor, the circuit shown in FIG. 3 has an optimal voltage range, and the circuit shown in FIG. 4 does not have an optimal voltage range.

In addition, since the gate voltage Vgs of a MOS transistor in the circuit shown in each of FIG. 5 and FIG. 6 is different from that in the circuit shown in each of FIG. 3 and FIG. 4 by the voltage across terminals of the memory element, the idea adopted for the circuits shown in FIGS. 3 and 4 can be applied to the circuits shown in FIGS. 5 and 6. Thus, similarly, the circuit shown in FIG. 5 has an optimal voltage range, and the circuit shown in FIG. 6 does not have an optimal voltage range.

Depending on conditions, such as an applied potential or the like, the resistance after writing is higher and the lower limit of the resistance at which erasing is enabled is lower. In this case, even the circuit shown in FIG. 4 or FIG. 6 may have an optimal voltage range.

The positional relationship between a memory element and a MOS transistor when taking into consideration that existence or nonexistence of an optimal voltage range is determined in accordance with the polarity of the memory element is described next.

An assumption that "disposing a memory element whose polarity is inverted" is equivalent, in terms of a characteristic, to "inverting the polarity of a MOS transistor, that is, using a P-type MOS transistor (hereinafter, referred to as a "Pmos") instead of a normal N-type MOS transistor (hereinafter, referred to as an "Nmos")" is described next with reference to FIGS. 11A to 11D.

Figure 11A:
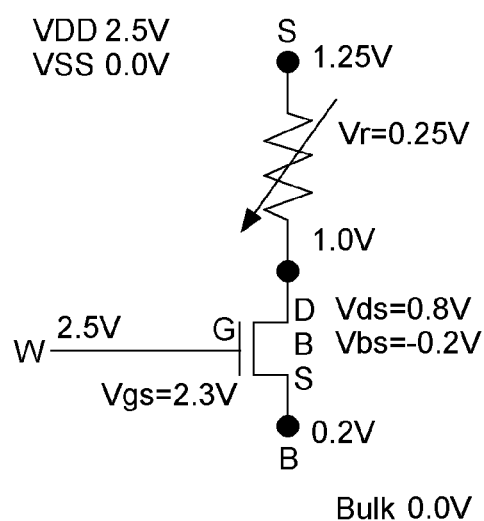
FIGS. 11A to 11D are schematic diagrams for explaining that disposing a memory element whose polarity is inverted is equivalent, in terms of a characteristic, to inverting the polarity of a MOS transistor.
Figure 11C:
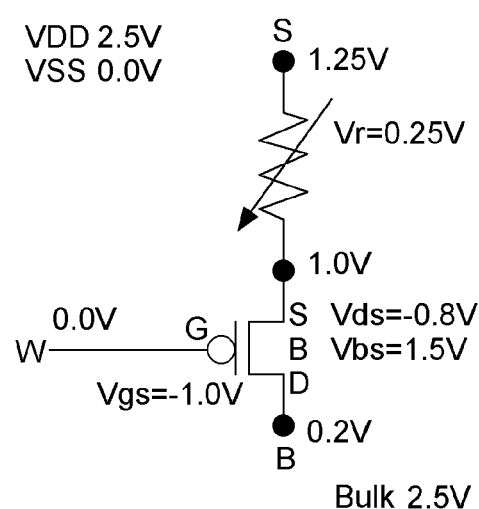
Figure 11B:
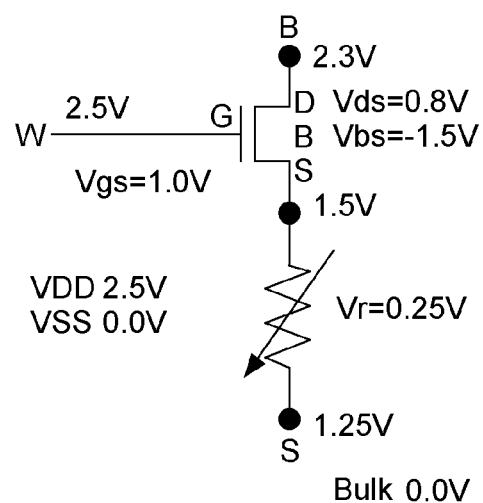

FIG. 11A shows a circuit similar to the circuit shown in FIG. 4. A circuit shown in FIG. 11B is different from the circuit shown in FIG. 11A in that the polarity of the memory element viewed from the source line is inverted. A circuit shown in FIG. 11C is different from the circuit shown in FIG. 11A in that, instead of an Nmos transistor, a Pmos transistor is used as a MOS transistor. A circuit shown in FIG. 11D is different from the circuit shown in FIG. 11A in that the polarity of the memory element viewed from the source line is inverted and in that a Pmos transistor, instead of an Nmos transistor, is used as a MOS transistor.

Figure 11D:
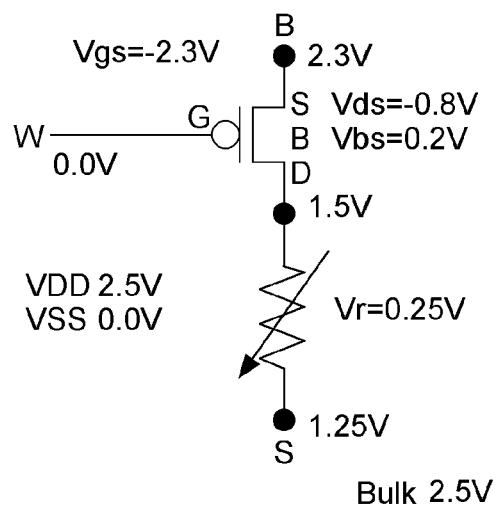

Since the polarity of the memory element in the circuit shown in FIG. 11D is inverted with respect to the polarity of the memory element in the circuit shown in FIG. 11A, when writing is performed, a memory cell shown in FIG. 11A provides a bit line closer to a VSS than the source line, and a memory cell shown in FIG. 11D provides a bit line closer to a VDD than the source line. In addition, the polarity of the gate voltage Vgs and the like is opposite between an Nmos transistor and a Pmos transistor.

As shown in FIGS. 11A and 11D, each of the voltages of the terminals of the memory element and the voltage of the MOS transistor (including the voltage Vgs between the gate and the source, the voltage Vds between the drain and the source, and the voltage Vbs between the bulk and the source) in the circuit shown in FIG. 11A has an inverted polarity with respect to but has the same absolute value as that in the circuit shown in FIG. 11D.

This means that the circuit shown in FIG. 11A and the circuit shown in FIG. 11D have the same electrical characteristic although the polarity in the circuit shown in FIG. 11A is inverted with respect to the polarity in the circuit shown in FIG. 11D.

Similarly to the relationship between the circuit shown in FIG. 11A and the circuit shown in FIG. 11D, the circuit shown in FIG. 11B and the circuit shown in FIG. 11C have the same electrical characteristic although the polarity in the circuit shown in FIG. 11B is inverted with respect to the polarity in the circuit shown in FIG. 11C.

Thus, based on the circuit shown in FIG. 11A, the circuit shown in FIG. 11B, which is obtained by "inverting the polarity of the memory element" of the circuit shown in FIG. 11A, is equivalent, in terms of an electrical characteristic, to the circuit shown in FIG. 11C, which is obtained by "inverting the polarity of the MOS transistor" of the circuit shown in FIG. 11A. Therefore, "disposing a memory element whose polarity is inverted" is equivalent, in terms of a characteristic, to "inverting the polarity of a MOS transistor".

However, a Pmos transistor whose gate width is equal to that of an Nmos transistor has a current driving force approximately half the current driving force of the Nmos transistor. Thus, in order to acquire a current driving force approximately equal to the current driving force of the Nmos transistor, it is necessary for the Pmos transistor to have a gate width about twice the gate width of the Nmos transistor. In addition, since a threshold voltage Vth of the Pmos transistor is slightly different from a threshold voltage Vth of the Nmos transistor, an identical electrical characteristic may not be achieved.

As described above, in order to realize writing and erasing on a memory element in the light of the fact that "disposing a memory element whose polarity is inverted" is equivalent, in terms of a characteristic, to "inverting the polarity of a MOS transistor", four types of configurations of a memory array are considered, as shown in FIGS. 3 to 6, in accordance with polarities of the memory element and the MOS transistor and a positional relationship between the memory element and the MOS transistor. When an Nmos transistor is used in the circuit shown in FIG. 4 or FIG. 6, an optimal voltage range does not exist. Thus, even if any potential is applied to a common line, erasing on a memory cell on which writing has been performed is not achieved. However, if a Pmos transistor whose electric polarity is opposite from the Nmos transistor is used, instead of the Nmos transistor, in the circuit shown in FIG. 4 or FIG. 6, a characteristic equivalent to that in the circuit shown in FIG. 3 or FIG. 5 in which the element polarity is inverted with respect to that in the circuit shown in FIG. 4 or FIG. 6 is achieved. Thus, an optimal voltage range is acquired, and writing and erasing on the memory element can be realized.

In other words, an optimal voltage range is acquired by selecting an optimal polarity of a MOS transistor, and writing and erasing on a memory cell is achieved by applying a potential within the optimal voltage range to a common line. More specifically, for a circuit in which a positional relationship between a memory element and a MOS transistor is equivalent to that in the circuit shown in FIG. 3 or FIG. 5, a memory cell includes an Nmos transistor. In addition, for a circuit in which a positional relationship between a memory element and a MOS transistor is equivalent to that in the circuit shown in FIG. 4 or FIG. 6, a memory cell includes a Pmos transistor. Accordingly, an optimal voltage range is acquired. Thus, when a potential within the optimal voltage range is applied to a common line, writing and erasing on a memory can be realized.

Thus, when it is difficult, in terms of manufacturing of a memory cell, to invert the positional relationship between a memory element and a MOS transistor or when it is necessary to adopt the positional relationship in the circuit shown in FIG. 4 or FIG. 6, adopting a Pmos transistor instead of an Nmos transistor enables writing and erasing on the memory element.

For example, as described in Japanese Patent Application No. 2004-50419, a storage device in which, unlike patterning an ion distribution layer constituting a memory element for each memory cell, a common ion distribution layer is used for all the memory cells adopts the circuit configuration shown in FIG. 4. (A selecting transistor can be connected only to a bit line side. In addition, due to a positive ion, writing can be performed such that the bit line potential is lower than the common source line potential, that is, the direction of the arrow of the memory element is a bit line direction.)

Figure 12:
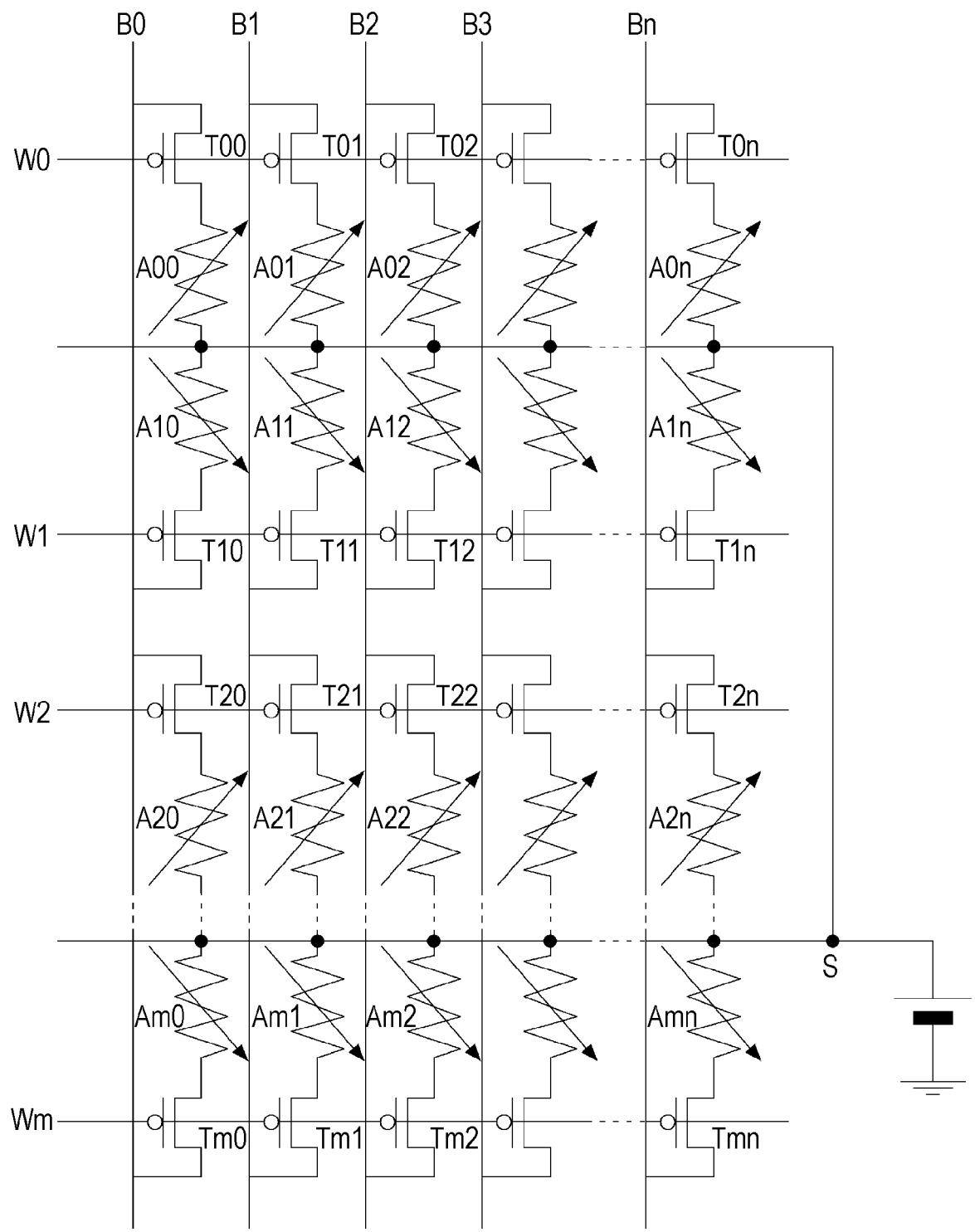
FIG. 12 is a circuit diagram in which an Nmos transistor in the circuit diagram shown in FIG. 4 is changed to a Pmos transistor.

However, writing and erasing on a memory element are not enabled in the circuit configuration shown in FIG. 4. Thus, if the positional relationship shown in FIG. 3 is adopted, an ion distribution layer is disposed below an insulting film. In this case, all the MOS transistors are electrically short-circuited, and the positional relationship in the circuit shown in FIG. 3 is not realized. Therefore, by adopting a Pmos transistor instead of an Nmos transistor when the positional relationship between the memory element and the MOS transistor is not capable of being inverted in terms of manufacturing of a memory cell, writing and erasing on the memory element can be achieved (see FIG. 12 in which the Nmos transistor shown in FIG. 4 is changed to a Pmos transistor).

In this case, obviously, the configuration shown in FIG. 5 or FIG. 6 in which a memory element is disposed near a bit line and a selecting transistor is disposed near a common terminal is not realized.

A memory cell having the above-described characteristics is used in the foregoing embodiment. In general, in a memory array including memory elements having a characteristic (1) in that an electrical characteristic is different depending on the polarity of the element and a characteristic (2) in that manufacturability is different depending on the polarity of the element, when the memory elements have configurations A and B (the positional polarity in the configuration A is opposite from the positional polarity in the configuration B), in a case where a characteristic (1) in that "a circuit operation is not enabled in the configuration A and a circuit operation is enabled in the configuration B" or "the circuit characteristic in the configuration B is better than the circuit characteristic in the configuration A" and a characteristic (2) in that "memory elements having the configuration A are capable of being manufactured and memory elements having the configuration B are not capable of being manufactured" or "memory elements having the configuration A are manufactured easier than memory elements having the configuration B" are achieved when an Nmos transistor is used as an access transistor Tr, if the Nmos transistor is replaced with a Pmos transistor, a characteristic (1) in that "a circuit operation is enabled in the configuration A and a circuit operation is not enabled in the configuration B" or "the circuit characteristic in the configuration A is better than the circuit characteristic in the configuration B" and a characteristic (2) in that "memory elements having the configuration A are capable of being manufactured and memory elements having the configuration B are not capable of being manufactured" or "memory elements having the configuration A are manufactured easier than memory elements having the configuration B" are achieved. In this case, it is desirable that a Pmos transistor be used as an access transistor Tr.

In contrast, in a case where a characteristic (1) in that "a circuit operation is enabled in the configuration A and a circuit operation is not enabled in the configuration B" or "the circuit characteristic in the configuration A is better than the circuit characteristic in the configuration B" and a characteristic (2) in that "memory elements having the configuration A are capable of being manufactured and memory elements having the configuration B are not capable of being manufactured" or "memory elements having the configuration A are manufactured easier than memory elements having the configuration B" are achieved when an Nmos transistor is used as an access transistor Tr, if the Nmos transistor is replaced with a Pmos transistor, a characteristic (1) in that "a circuit operation is enabled in the configuration A and a circuit operation is not enabled in the configuration B" or "the circuit characteristic in the configuration B is better than the circuit characteristic in the configuration A" and a characteristic (2) in that "memory elements having the configuration A are capable of being manufactured and memory elements having the configuration B are not capable of being manufactured" or "memory elements having the configuration A are manufactured easier than memory elements having the configuration B" are achieved. In this case, it is desirable that an Nmos transistor be used as an access transistor Tr.

It should be understood by those skilled in the art that various modifications, combinations, sub-combinations and alterations may occur depending on design requirements and other factors insofar as they are within the scope of the appended claims or the equivalents thereof.

What is claimed is:

1. A storage device comprising:
    a storage element having a first terminal and a second terminal that cause a first electrical characteristic change when an electric signal of a first threshold level or higher is applied and that cause a second electrical characteristic change, which is asymmetrical to the first electrical characteristic change, when an electric signal of a second threshold level or higher, the polarity of the electric signal of the second threshold level or higher being different from the polarity of the electric signal of the first threshold level or higher, is applied; and
    a unipolar transistor connected in series with the storage element,
    wherein only one of the first terminal and the second terminal of the storage element is electrically connected to the unipolar transistor, and
    wherein the unipolar transistor has a negative polarity or a positive polarity in accordance with the first terminal or the second terminal that is electrically connected to the unipolar transistor.

2. A storage device comprising:
    a plurality of memory cells each including
        a storage element having a characteristic in that the resistance thereof changes from a higher state to a lower state when an electric signal of a first threshold level or higher is applied and in that the resistance changes from the lower state to the higher state when an electric signal of a second threshold level or higher, the polarity of the electric signal of the second threshold level or higher being different from the polarity of the electric signal of the first threshold level or higher, is applied, and
        a unipolar transistor connected in series with the storage element,
    wherein a predetermined potential is applied to a first end of each of the memory cells, and a first potential that is higher than the predetermined potential or a second potential that is lower than the predetermined potential is applied to a second end of each of the memory cells near the unipolar transistor,
    wherein the polarity of the unipolar transistor is negative when information is written to the storage element by application of the first potential to the second end of each of the memory cells, and
    wherein the polarity of the unipolar transistor is positive when information is written to the storage element by application of the second potential to the second end of each of the memory cells.

3. The storage device according to claim 2, wherein:
    the storage element includes a storage layer sandwiched between a first electrode and a second electrode;
    the resistance changes from the higher state to the lower state when the electric signal of the first threshold level or higher is applied across the first electrode and the second electrode; and
    the resistance changes from the lower state to the higher state when the electric signal of the second threshold level or higher is applied across the first electrode and the second electrode.

4. The storage device according to claim 2, wherein the resistance of the storage element after writing is completed changes in accordance with the amount of current when the writing is performed.

5. The storage device according to claim 3, wherein at least part of layers forming storage layers of a plurality of adjacent memory cells is formed by a common layer.

6. A storage device comprising:
    a plurality of memory cells each including
        a storage element that includes a storage layer sandwiched between a first electrode and a second electrode and that has a characteristic in that the resistance thereof changes from a higher state to a lower state when an electric signal of a first threshold level or higher is applied across the first electrode and the second electrode and in that the resistance changes from the lower state to the higher state when an electric signal of a second threshold level or higher, the polarity of the electric signal of the second threshold level or higher being different from the polarity of the electric signal of the first threshold level or higher, is applied across the first electrode and the second electrode, and a unipolar transistor connected in series with a portion of the storage element near the second electrode, wherein first electrodes of the plurality of memory cells are formed by an identical metal layer, and wherein the unipolar transistor has a positive polarity.

7. A semiconductor apparatus comprising:
a storage device including
a plurality of memory cells each including
a storage element that includes a storage layer sandwiched between a first electrode and a second electrode and that has a characteristic in that the resistance thereof changes from a higher state to a lower state when an electric signal of a first threshold level or higher is applied across the first electrode and the second electrode and in that the resistance changes from the lower state to the higher state when an electric signal of a second threshold level or higher, the polarity of the electric signal of the second threshold level or higher being different from the polarity of the electric signal of the first threshold level or higher, is applied across the first electrode and the second electrode, and a unipolar transistor connected in series with a portion of the storage element near the second electrode, wherein first electrodes of the plurality of memory cells are formed by an identical metal layer, and wherein the unipolar transistor has a positive polarity.

* * * * *